US 11,041,087 B2

(12) United States Patent
Coulson et al.

(10) Patent No.: US 11,041,087 B2
(45) Date of Patent: Jun. 22, 2021

(54) COATINGS

(71) Applicant: P2i Ltd, Abingdon (GB)

(72) Inventors: Stephen Richard Coulson, Abingdon (GB); Delwyn Evans, Abingdon (GB); Angeliki Siokou, Abingdon (GB); Clive Telford, Abingdon (GB)

(73) Assignee: P2i Ltd, Abingdon (GB)

( * ) Notice: Subject to any disclaimer, the term of this patent is extended or adjusted under 35 U.S.C. 154(b) by 0 days.

(21) Appl. No.: 16/547,728

(22) Filed: Aug. 22, 2019

(65) Prior Publication Data

US 2019/0375961 A1   Dec. 12, 2019

Related U.S. Application Data

(63) Continuation of application No. 15/735,130, filed as application No. PCT/GB2016/051688 on Jun. 8, 2016, now Pat. No. 10,421,876.

(30) Foreign Application Priority Data

Jun. 9, 2015   (EP) ..................................... 15386017

(51) Int. Cl.
| C09D 133/16 | (2006.01) |
| C09D 5/00 | (2006.01) |
| B05D 1/00 | (2006.01) |
| B05D 5/08 | (2006.01) |
| H01J 37/32 | (2006.01) |
| H01L 21/02 | (2006.01) |
| H01L 21/56 | (2006.01) |
| H01L 23/29 | (2006.01) |
| H01L 23/00 | (2006.01) |
| H05K 3/28 | (2006.01) |

(52) U.S. Cl.
CPC ............. *C09D 133/16* (2013.01); *B05D 1/62* (2013.01); *B05D 5/08* (2013.01); *B05D 5/083* (2013.01); *C09D 5/00* (2013.01); *H01J 37/32082* (2013.01); *H01J 37/32467* (2013.01); *H01J 2237/332* (2013.01); *H01J 2237/3382* (2013.01); *H01L 21/02118* (2013.01); *H01L 21/02274* (2013.01); *H01L 21/56* (2013.01); *H01L 23/293* (2013.01); *H01L 23/564* (2013.01); *H05K 3/285* (2013.01)

(58) Field of Classification Search
None
See application file for complete search history.

(56) References Cited

U.S. PATENT DOCUMENTS

| 2,716,638 A | 8/1955 | Cohen et al. |
| 3,816,564 A | 6/1974 | Holliday et al. |
| 4,562,091 A | 12/1985 | Sachdev et al. |
| 4,822,632 A | 4/1989 | Williams et al. |
| 5,804,669 A | 9/1998 | Tropsch et al. |

(Continued)

FOREIGN PATENT DOCUMENTS

| CN | 103881013 A | 6/2014 |
| EP | 0834352 A1 | 4/1998 |

(Continued)

OTHER PUBLICATIONS

Machine translation of WO 2010/101091 A1, retrieved Sep. 2020 (Year: 2020).*

(Continued)

*Primary Examiner* — Nicole M Buie-Hatcher
(74) *Attorney, Agent, or Firm* — Kagan Binder, PLLC

(57) ABSTRACT

The present invention provides an electronic or electrical device or component thereof comprising a cross-linked polymeric coating on a surface of the electronic or electrical device or component thereof; wherein the cross-linked polymeric coating is obtainable by exposing the electronic or electrical device or component thereof to a plasma comprising a monomer compound and a crosslinking reagent for a period of time sufficient to allow formation of the cross-linked polymeric coating on a surface thereof, wherein the monomer compound has the following formula:

$$\underset{R_2}{\overset{R_1}{\diagdown}}C=C\underset{R_4}{\overset{R_3}{\diagdown}}$$

where $R_1$, $R_2$ and $R_4$ are each independently selected from hydrogen, optionally substituted branched or straight chain $C_1$-$C_6$ alkyl or halo alkyl or aryl optionally substituted by halo, and $R_3$ is selected from:

[chemical structures showing ester groups with $-O-(CX_2)_{n_1}-CX_3$ chains]

where each X is independently selected from hydrogen, a halogen, optionally substituted branched or straight chain $C_1$-$C_6$ alkyl, halo alkyl or aryl optionally substituted by halo; and $n_1$ is an integer from 1 to 27; and wherein the crosslinking reagent comprises two or more unsaturated bonds attached by means of one or more linker moieties and has a boiling point at standard pressure of less than 500° C.

14 Claims, 6 Drawing Sheets

(56) References Cited

U.S. PATENT DOCUMENTS

| | | | |
|---|---|---|---|
| 5,925,420 A * | 7/1999 | Lee | C08G 61/02 427/226 |
| 6,207,238 B1 | 3/2001 | Affinito | |
| 6,214,423 B1 | 4/2001 | Lee et al. | |
| 6,551,950 B1 | 4/2003 | Badyal et al. | |
| 6,613,393 B1 | 9/2003 | Rauschnabel et al. | |
| 6,764,758 B1 | 7/2004 | Grunze et al. | |
| 7,439,315 B2 | 10/2008 | Kunimi et al. | |
| RE43,651 E | 9/2012 | Badyal et al. | |
| 8,852,693 B2 | 10/2014 | Legein et al. | |
| 10,421,876 B2 | 9/2019 | Coulson et al. | |
| 2004/0028931 A1 | 2/2004 | Bletsos et al. | |
| 2004/0046165 A1 | 3/2004 | Hunze et al. | |
| 2005/0034667 A1 | 2/2005 | Tsuji et al. | |
| 2005/0141738 A1 | 6/2005 | Karamuk | |
| 2006/0068519 A1 * | 3/2006 | Dunbar | H01L 51/0545 438/82 |
| 2006/0122301 A1 | 6/2006 | Nair et al. | |
| 2007/0020451 A1 * | 1/2007 | Padiyath | B05D 7/58 428/336 |
| 2009/0267489 A1 | 10/2009 | Arita et al. | |
| 2010/0021998 A1 | 1/2010 | Sanyal et al. | |
| 2010/0189914 A1 | 7/2010 | Coulson | |
| 2010/0203347 A1 | 8/2010 | Coulson | |
| 2011/0148979 A1 | 6/2011 | Breton et al. | |
| 2012/0009231 A1 | 1/2012 | Herbert et al. | |
| 2012/0051018 A1 | 3/2012 | Ollgaard | |
| 2012/0171386 A1 | 7/2012 | Bicker et al. | |
| 2012/0321775 A1 | 12/2012 | Parker | |
| 2013/0136936 A1 | 5/2013 | Morozumi et al. | |
| 2013/0176700 A1 | 7/2013 | Stevens et al. | |
| 2014/0010969 A1 | 1/2014 | Bicker et al. | |
| 2014/0322525 A1 | 10/2014 | Legein et al. | |
| 2014/0342103 A1 | 11/2014 | Petersen et al. | |
| 2015/0125695 A1 * | 5/2015 | Huebsch | C09D 4/00 428/393 |
| 2015/0291830 A1 | 10/2015 | Galbreath et al. | |
| 2016/0284518 A1 | 9/2016 | Legein et al. | |
| 2018/0171171 A1 | 6/2018 | Coulson et al. | |
| 2019/0335592 A1 | 10/2019 | Coulson et al. | |

FOREIGN PATENT DOCUMENTS

| | | | |
|---|---|---|---|
| EP | 1557489 A1 | 7/2005 | |
| EP | 2711153 A1 | 3/2014 | |
| GB | 2434368 A | 7/2007 | |
| GB | 2477410 A * | 8/2011 | B05D 3/142 |
| GB | 2493264 A | 1/2013 | |
| WO | 9858117 A1 | 12/1998 | |
| WO | 9964662 A1 | 12/1999 | |
| WO | WO-0005000 A1 * | 2/2000 | C23C 16/515 |
| WO | 0228548 A2 | 4/2002 | |
| WO | 03063938 A1 | 8/2003 | |
| WO | 2003097245 A2 | 11/2003 | |
| WO | 03/101621 A2 | 12/2003 | |
| WO | 2004065684 A2 | 8/2004 | |
| WO | 2005021833 A2 | 3/2005 | |
| WO | 2005089961 A1 | 9/2005 | |
| WO | 2006129800 A1 | 12/2006 | |
| WO | 2007083122 A1 | 7/2007 | |
| WO | 2009030435 A1 | 3/2009 | |
| WO | 2009046093 A2 | 4/2009 | |
| WO | WO-2010101091 A1 * | 9/2010 | C09K 3/18 |
| WO | 2011029628 A1 | 3/2011 | |
| WO | 2012158953 A1 | 11/2012 | |
| WO | 2012168440 A1 | 12/2012 | |
| WO | 2013132250 A1 | 9/2013 | |
| WO | 2014026967 A1 | 2/2014 | |
| WO | 2014026967 A2 | 2/2014 | |
| WO | 2014155099 A1 | 10/2014 | |
| WO | 2015128627 A1 | 9/2015 | |
| WO | 2016198855 A1 | 12/2016 | |
| WO | 2016198856 A1 | 12/2016 | |

OTHER PUBLICATIONS

International Search Report and Written Opinion for International Application No. PCT/GB2016/051688, dated Nov. 8, 2016 (9 pages).
Elongiovanni et al. "High performance UV-cured coatings for wood protection", Progress in Organic Coatings, 2002, 45, 359-363.
Search Report under Section 17(5) from UK Patent Application No. GB1403558.8, dated Aug. 13, 2014 (4 pages).
International Search Report and Written Opinion from International Application No. PCT/GB2015/050521, dated Jun. 5, 2015 (16 pages).
Search Report under Section 17(5) from UK Patent Application No. GB1503054.7, dated Nov. 30, 2015 (4 pages).
"Plasma treatment can apply liquid repellency to any material", Technical Textiles International, May 2005, pp. 23-25 (3 pages).
Guimond et al., "Influence of gas phase and surface reactions on plasma polymerization", Surface & Coatings Technology, vol. 205, Supplement 2, pp. 447-450, 2011, (4 pages).
Yasuda, "Plasma Polymerization", Academic Press, Inc., Orlando, Florida, 1985, (22 pages).
Declaration of Gregory N. Parsons, Ph.D., Exhibit 2001, Case IPR2020-01198, filed Oct. 30, 2020, (109 pages).
Patent Owner's Preliminary Response, Case IPR2020-01198, filed Oct. 30, 2020, (70 pages).
Patent Owner's Sur-Reply to Petitioner's Reply to Preliminary Response, Case IPR2020-01198, filed Dec. 8, 2020, (9 pages).
Petitioner's Reply to Patent Owner's Preliminary Response, Case IPR2020-01198, filed Dec. 1, 2020, (8 pages).
Petition for Inter Partes Review for U.S. Pat. No. 10,421,876, dated Jul. 17, 2020, (90 pages).
Yao et al., "Fluorinated poly(meth)acrylate: Synthesis and properties," vol. 55, Isse. 24, pp. 6197-6211, 2014, (15 pages).
Sartomer Company Material Safety Data Sheet, Product CD406, dated Jun. 9, 2005, (7 pages).
Declaration of Dr. Karen Gleason, Exhibit 1002, Case IPR2020-01198, filed Jul. 17, 2020, (117 pages).
Curriculum Vitae for Karen K. Gleason, Exhibit 1003, Case IPR2020-01198, filed Jul. 17, 2020, (34 pages).
Francesch et al., "Fabrication of Bioactive Surfaces by Plasma Polymerization Techniques Using a Novel Acrylate-Derived Monomer", Plasma Processes and Polymers, vol. 2, Isse. 8, pp. 605-611, 2005, (7 pages).
Declaration of Dr. Salvador Borrós Gómez, Exhibit 1010, Case IPR2020-01198, filed Jul. 17, 2020, (3 pages).
Coulson et al., "Ultralow Surface Energy Plasma Polymer Films", Chemistry of Materials, vol. 12, No. 7, pp. 2031-2038, 2000, (8 pages).
Tarducci et al., "Synthesis of Cross-Linked Ethylene Glycol Dimethacrylate and Cyclic Methacrylic Anhydride Polymer Structures by Pulsed Plasma Deposition", Macromolecules, vol. 35, No. 23, pp. 8724-8727, 2002, (4 pages).
Yagüe et al., "Enhanced Cross-Linked Density by Annealing on Fluorinated Polymers Synthesized via Initiated Chemical Vapor Deposition to Prevent Surface Reconstruction", Macromolecules, vol. 46, Isse. 16, pp. 6379-6670, 2013, (7 pages).
Yasuda, "Plasma Polymerization", Academic Press, London, 1985, (58 pages).
Kurosawa et al., "Detection of deposition rate of plasma-polymerized acrylate and methacrylate derivatives using quartz crystal microbalance," Thin Solid Films, vol. 457, Isse. 1, pp. 26-33, 2004, (8 pages).
Kurosawa et al., "Detection of deposition rate of plasma-polymerized silicon-containing films by quartz crystal microbalance," Thin Solid Films, vol. 407, Isses. 1-2, pp. 1-6, 2002, (6 pages).
Joback et al., "Estimation of Pure-Component Properties from Group-Contributions," Chemical Engineering Communications, vol. 57, Isses. 1-6, pp. 233-243, 1987, (12 pages).
"Experimental Physico-chemical Properties" retrieved from 'www.chemspider.com/Chemical-Structure.68328.html?rid=8eaa4787-5d2d-42d7-a4b13-7b352bcd4806', on Jul. 9, 2020, (14 pages).

(56) References Cited

OTHER PUBLICATIONS

Declaration of S. Rampersad, Exhibit 1020, Case IPR2020-01198, filed Jul. 17, 2020, (7 pages).
Granting Institution of Inter Partes Review for U.S. Pat. No. 10,421,876, filed Jan. 27, 2021, (50 pages).
Scheduling Order for U.S. Pat. No. 10,421,876, filed Jan. 27, 2021, (11 pages).
Notice Regarding Filing of Disclaimer of Claims in a Patent Under 37 C.F.R.§1.321(a) for U.S. Pat. No. 10,421,876, filed Apr. 20, 2021, (4 pages).
Disclaimer in Patent Under 37 C.F.R. § 1.321(a) for U.S. Pat. No. 10,421,876, filed Apr. 14, 2021, (9 pages).
Motion for Termination of Proceeding Pursuant to 37 C.F.R. §42.72 for U.S. Pat. No. 10,421,876, filed May 3, 2021, (8 pages).
Petitioner's Opposition to Patent Owners Motion for Termination for U.S. Pat. No. 10,421,876, filed May 3, 2021, (9 pages).

\* cited by examiner

| Name | Description |
|---|---|
| —— PFAC6 | Sample 350 By Administrator Date Thursday, February 13 2014 |
| ---- PFAC6-DVA(10%) | Sample 389 By PEService Date Tuesday, July 14 2015 |

COATINGS

This application is a Continuation of application Ser. No. 15/735,130 filed Dec. 8, 2017, which is a U.S. national stage filing of Patent Cooperation Treaty (PCT) application serial number PCT/GB2016/051688 filed on Jun. 8, 2016, which claims the benefit of European Application Serial Number 15386017.6, filed Jun. 9, 2015, wherein the entirety of each of said patent applications is incorporated herein by reference.

FIELD OF THE INVENTION

This invention relates to protective coatings. Specifically, the present invention relates to protective coatings for electronic or electrical devices and components thereof, and methods of forming such coatings. The coatings can protect by being hydrophobic and so resist the ingress of water-based liquid into electronic devices, or they can protect by forming a barrier coating and so provide electrical resistance between the electrical parts of the phone and water based liquid.

BACKGROUND OF THE INVENTION

The perfluoroalkyl chain monomers are also used for generating hydrophobic surfaces from pulsed plasma deposition processes (see WO 9858117 A1).

The power of the plasma initiated polymerisation affects the nature of the polymer produced. The higher average energy inputs of continuous wave plasmas lead to more fragmentation of the monomer, and so the polymer loses structural properties of the monomer. In the case of 1H,1H,2H,2H-perfluorodecyl acrylate (PFAC8), there's less retention of the perfluoroalkyl chain and the contact angle of the surface coating is compromised. Higher plasma energies also lead to more crosslinking. For the lower average energy inputs of pulsed plasmas, there's better retention of monomer structure and less crosslinking. The greater retention of the perfluoro chain under low energy, pulsed plasma conditions leads to best levels of contact angles for the surface coating.

When the perfluoroalkyl chains have eight or more fluorinated carbons (long chain), the polymer made from the monomer has a crystalline structure. When the perfluoroalkyl chains have less than eight fluorinated carbons, the resulting polymer is amorphous and so can be unstable in the presence of water (see "Molecular Aggregation Structure and Surface Properties of Poly(fluoroalkyl acrylate) Thin Films, Marcomolecules, 2005, vol 38, p5699-5705)

When long chain perfluoroalkyl polymers are produced by high average power (continuous wave or CW) or low average power (pulsed wave or PW) plasmas, then because of the crystalline structure of the long chains, the polymers are non-stick to the touch and stable in the presence of water. However, the feel and water stability of shorter chain polymer coatings is affected by the plasma power levels used. For example, when PFAC6 (1H,1H,2H,2H-perfluorooctyl acrylate) is polymerised in low power plasma conditions, the resulting polymer coating can have several disadvantages. For example the coating can cause water drops to spread out a little (slump), be marked by the presence of a water drop on its surface, have a tacky feel, or can be easily smeared (for example on substrates of silicon wafer and ABS plastic).

By increasing the power of the plasma used for polymerisation, the polymer becomes more crosslinked and becomes more resistant to smearing. However, increasing the power has the concomitant effect of decreasing the water contact angle through more monomer fragmentation (as described above). FIG. 1 shows the effect of increasing the power to monomer flow ratio for CW plasmas in a 125 litre chamber: at a ratio of 4 W/μl/min, the water contact angle is ~85-95 degrees and the coating is tack-free. However, as the ratio drops, the contact angle increases and the occurrence of tacky/smudgy coatings increases too. FIG. 2 shows the same effect for pulsed plasma conditions. These results show that the process window for producing tack and smudge-free coatings have a limited plasma processing range and the final coating has a compromised water contact angle.

Accordingly, it is an aim to solve one or more of the above-mentioned problems with the prior art coatings.

STATEMENT OF INVENTION

An aspect of the present invention provides an electronic or electrical device or component thereof comprising a protective cross-linked polymeric coating on a surface of the electronic or electrical device or component thereof;

wherein the protective cross-linked polymeric coating is obtainable by exposing the electronic or electrical device or component thereof to a plasma comprising a monomer compound and a crosslinking reagent for a period of time sufficient to allow formation of the protective cross-linked polymeric coating on a surface thereof, wherein the monomer compound has the following formula:

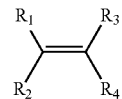

where $R_1$, $R_2$ and $R_4$ are each independently selected from hydrogen, optionally substituted branched or straight chain $C_1$-$C_6$ alkyl or halo alkyl or aryl optionally substituted by halo, and $R_3$ is selected from:

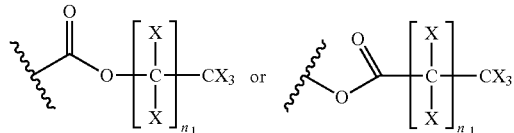

where each X is independently selected from hydrogen, a halogen, optionally substituted branched or straight chain $C_1$-$C_6$ alkyl, halo alkyl or aryl optionally substituted by halo; and $n_1$ is an integer from 1 to 27; and wherein the crosslinking reagent comprises two or more unsaturated bonds attached by means of one or more linker moieties and has a boiling point of less than 500° C. at standard pressure.

High levels of polymer crosslinking (formerly only achievable with high average power continuous wave plasmas) can be achieved by adding a crosslinking molecule to the monomer to produce a cross-linked co-polymer. This has the advantage of increasing the plasma processing range so stable coatings can now be produced in low average energy pulse plasma conditions.

The high degree of retention of the hydrophobic monomer structures from the low energy pulsed plasma gives coatings of the co-polymer a good hydrophobic coating (as evidenced by water contact angles) and a coating that is not sticky or smeary to the touch. Thus, these properties make it suitable for the coating of electronic devices to prevent the ingress of water-based liquids from accidental damage. Such coatings typically have a thickness between 1 and 100 nm, preferably 1 and 50 nm.

The coating may be described as a liquid repellant layer, typically a water repellant layer. The coating may repel water, an aqueous liquid such as rainwater, or oil.

Alternatively, or in addition to providing a liquid repellent layer, the coating may be a physical barrier layer.

The coating may be a physical barrier i.e. it provides a physical barrier to mass and electron transport.

The physical barrier layer restricts diffusion of water, oxygen and ions. When the coating is a physical barrier it typically has a thickness of greater than 50 nm.

The coating is a protective layer i.e. it prevents damage by contact with water or other liquids. The coating may provide is protective functionality by forming a liquid repellent layer and/or a physical barrier layer.

The coating is preferably substantially pin-hole free to enable it to provide a physical barrier. Preferably $\Delta Z/d<0.15$, where $\Delta Z$ is the average height variation on an AFM line scan in nm (as shown in FIG. 3) and d is coating thickness in nm.

The value of $\Delta Z/d$ tells us to what extent defects/voids on the surface of the coating extend into the coating, i.e. the percentage value of the depth of defect over total coating thickness. For example, $\Delta Z/d=0.15$ means that the voids on the surface only extend down to 15% of the coating thickness. A coating with a $\Delta Z/d<0.15$ is defined herein as being substantially pinhole free. If voids are bigger than this, the desired functionality is unlikely to be achieved.

The coating is preferably conformal, which means that it takes the 3D shape of the electronic or electrical device or component thereof and covers substantially an entire surface of the device. This has the advantage of ensuring that the coating has sufficient thickness to give optimal functionality over an entire surface of the device or component. The meaning of the term "covers substantially an entire surface" will depend to some extent on the type of surface to be covered. For example, for some components, it may be necessary for there to be complete coverage of the surface in order for the component to function after submersion in water. However, for other components or housings, small gaps in coverage may be tolerated.

The coating may have a thickness of 50 to 10,000 nm, optionally 50 to 8000 nm, 100 to 5000 nm, preferably 250 nm-5000 nm, most preferably 250 nm-2000 nm.

The coating may be electrically insulating and be sufficiently compliant that electrical connectors can be joined to the electronic or electrical device or component thereof and an electrical connection made between the electrical connectors and electronic or electrical device or component thereof without the requirement to first remove the coating. In this case, the force exerted by the electrical connector on the coating is sufficient to alter the structure of or even break through the coating local to the electrical connector, allowing the electrical connection to be made. Electrical connectors can typically be joined to the electronic or electrical device or component in this way for coating thicknesses of under 5000 nm, and for high performance coatings below 2000 nm.

The electronic or electrical device or component thereof can typically withstand immersion in up to 1 m of water for over 30 minutes without failure or corrosion whilst power applied to the electronic or electrical device or component. The effectiveness of the coating can be determined by measuring its electrical resistance at a fixed voltage when submerged in water for a set time period; for example, applying a voltage of 8V to the coating of a device which is submerged in water for 13 minutes. Coatings having a resistance value of $1 \times 10^7$ Ohms or higher in this test are effective barrier coatings and the coated electronic or electrical device or component thereof will pass successfully an IPX7 test. The IPX7 test is the Ingress Protection Marking which classifies and rates the degree of protection provided against water. In the IPX7 test for phones, the device is immersed in water under defined conditions of pressure and time (up to 1 m of submersion) for a duration of 30 minutes. The device has to be powered on during testing and functional after 24 hrs.

In one embodiment, the coating is electrically insulating and has a thickness of less than 1 micron and wherein a force of 5-20 g applied to the coating using a round probe with 1 mm diameter allows an electrical connection to be made with the electronic or electrical device or component thereof in the local area where the force has been applied.

In another embodiment, the coating is electrically insulating and has a thickness of 1-2.5 microns and wherein a force of 20-100 g applied to the coating using a round probe with 1 mm diameter allows an electrical connection to be made in the local area of the coating where the force has been applied.

The coating may have a higher density than that of the corresponding monomer from which it is formed. For example, the increase in density may be at least 0.1 g/cm³' The increase in density is explained by the highly cross-linked coating. The high density of the coating improves the barrier properties of the coating.

The coating may form a surface defined by a static water contact angle (WCA) of at least 70°. A coating with a WCA of at least 90° is a liquid repellent, typically a water repellent layer. For fluorinated polymers, the coating may have a static water contact angle of at least 100°. The contact angle of a liquid on a solid substrate gives an indication of the surface energy which in turn illustrates the substrate's liquid repellence. Contact angles were measured on a VCA Optima contact angle analyser, using 3 µl droplets of deionised water at room temperature.

Crosslinker

A basic requirement for the cross-linking reagent is the presence two or more unsaturated bonds, for example, —C=C— or alkyne groups. The unsaturated bonds are attached by one or more linker moieties. The linker moiety is not especially limited provided it joins together the two or more unsaturated bonds. The cross-linking reagent must have a boiling point of less than 500° C., preferably from −10 to 300° C., optionally 180 to 270° C., most preferably 205 to 260° C. at standard pressure. It is a preference, but not a requirement, that the cross-linking reagent is not unduly hazardous for use in plasma processing, that is to say it can be used in a production environment where low levels of vapour do not present any significant health and safety issues (e.g. strongly oxidising, explosive, toxic, or has an offensive odour (e.g. stench reagent)). The crosslinking reagent preferably has one of the following structures:

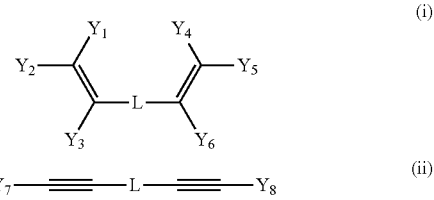

where $Y_1$, $Y_2$, $Y_3$, $Y_4$, $Y_5$, $Y_6$, $Y_7$ and $Y_8$ are each independently selected from hydrogen, optionally substituted cyclic, branched or straight chain $C_1$-$C_6$ alkyl or aryl; and L is a linker moiety.

Most preferably L has the following formula:

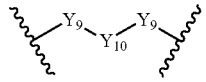

(iii)

where each $Y_9$ is independently selected from, a bond, —O—, —O—C(O)—, —C(O)—O—, —$Y_{11}$—O—C(O)—, —C(O)—O—$Y_{ii}$—, —O$Y_{11}$—, and —$Y_{11}$O—, where $Y_{11}$ is an optionally substituted cyclic, branched or straight chain $C_1$-$C_8$ alkylene; and $Y_{10}$ is selected from optionally substituted cyclic, branched or straight chain $C_1$-$C_8$ alkylene and a siloxane containing group.

In one most preferred embodiment $Y_{10}$ has the following formula:

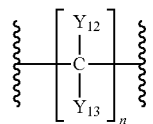

(iv)

wherein each $Y_{12}$ and $Y_{13}$ is independently selected from H, halo, optionally substituted cyclic, branched or straight chain $C_1$-$C_8$ alkyl, or —O$Y_{14}$, where $Y_{14}$ is selected from optionally substituted branched or straight chain $C_1$-$C_8$ alkyl or alkenyl, and n is an integer from 1 to 10.

Optionally, each $Y_{12}$ is H and each $Y_{13}$ is H, i.e. $Y_{10}$, is a linear alkylene chain. For this embodiment $Y_9$ is preferably a vinyl ester or vinyl ether group.

Optionally, each $Y_{12}$ is fluoro and each $Y_{13}$ is fluoro, i.e. $Y_{10}$ is a linear perfluoroalkylene chain.

Typically, n is from 4 to 6.

In another embodiment $Y_{10}$ has the following formula:

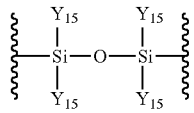

(v)

wherein each $Y_{15}$ is independently selected from optionally substituted branched or straight chain $C_1$-$C_6$ alkyl.

In one embodiment each $Y_{15}$ is methyl, and each $Y_9$ is a bond.

In a further embodiment $Y_{10}$ has the following formula:

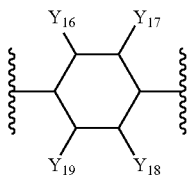

(vi)

wherein $Y_{16}$ to $Y_{19}$ are each independently selected from H and optionally substituted branched or straight chain $C_1$-$C_8$ alkyl or alkenyl. A preferred alkenyl group is vinyl.

Optionally $Y_{18}$ is H or vinyl, and $Y_{16}$, $Y_{17}$ and $Y_{19}$ are each H. In one embodiment each of $Y_{16}$ to $Y_{19}$ is H. In another embodiment $Y_{18}$ is vinyl, and $Y_{16}$, $Y_{17}$ and $Y_{19}$ are each H.

In preferable embodiments for compound (i), L has one of the following structures:

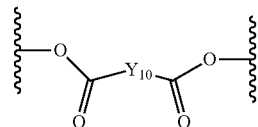

(vii)

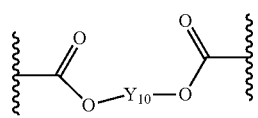

(viii)

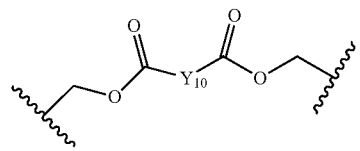

(ix)

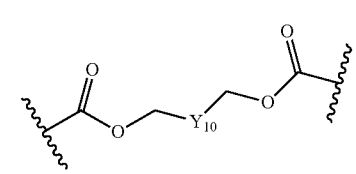

(x)

In another embodiment for compound (i) L has one of the following structures:

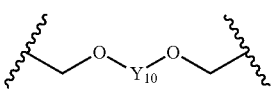

(xi)

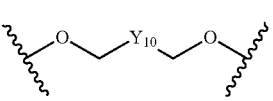

(xii)

For L according structure (vii), $Y_{10}$ is preferably an alkylene chain or a cycloalkylene, such as those shown in structures iv) and vi) above. The alkylene chain may be a straight chain alkylene chain. When $Y_{10}$ is a cycloalkylene, cyclohexylene is preferred, most preferably 1,4 cyclohexylene.

For L according to structure (viii), $Y_{10}$ is preferably structure (iv), i.e. an alkylene or fluoroalkylene chain.

For L according to structure (ix), $Y_{10}$ is preferably cycloalkylene, such as the cyclohexylene according to structure (vi).

For L according to structure (x), $Y_{10}$ is preferably structure (iv) wherein each $Y_{12}$ and $Y_{13}$ is F, i.e. a perfluoroalkylene chain.

For L according to structure (xi) or structure (xii) $Y_{10}$ is preferably alkylene or cycloalkylene. Optionally the alkylene or cycloalkylene may be substituted with one or more vinyl groups or alkenyl ether groups, preferably one or more vinyl ether groups.

When each $Y_9$ is a bond, each $Y_{10}$ may be any of structures (iv), (v) and (vi). Preferably $Y_{10}$ is a straight chain alkylene such that the crosslinking reagent is a diene, such as a heptadiene, octadiene, or nonadiene, most preferably 1,7-octadiene.

When each $Y_9$ is O, each $Y_{10}$ is preferably a branched or straight chain $C_1$-$C_6$ alkylene, preferably a straight chain alkylene, most preferably a $C_4$ straight chain alkylene, i.e the crosslinking reagent is 1,4-butanediol divinyl ether It will be understood that each $Y_9$ group can be combined with any other $Y_9$ group and $Y_{10}$ group to form the crosslinking reagent.

The skilled person will be aware of possible substituents for each of the cyclic, branched or straight chain $C_1$-$C_8$ alkylene groups mentioned above. The alkylene groups may be substituted at one or more positions by a suitable chemical group. Halo substituents are preferred, with fluoro substituents most preferred. Each $C_1$-$C_8$ alkylene group may be a $C_1$-$C_3$, $C_2$-$C_6$, or $C_6$-$C_8$ alkylene group.

Particularly preferred embodiments of the crosslinker have alkyl chains for $Y_{10}$ and vinyl ester or vinyl ether groups on either side.

A particularly preferred cross-linking reagent is divinyl adipate. (a divinyl ester)

Another preferred cross-linking reagent is 1,4-butanediol divinyl ether (a divinyl ether)

For the most preferred embodiments the crosslinking reagent is selected from Divinyl Adipate (DVA), 1,4 Butanediol divinyl ether (BDVE), 1,4 Cyclohexanedimethanol divinyl ether (CDDE), 1,7-Octadiene (17OD), 1,2,4-Trivinylcyclohexane (TVCH), 1,3-Divinyltetramethyldisiloxane (DVTMDS), Diallyl 1,4-cyclohexanedicarboxylate (DCHD), 1,6-Divinylperfluorohexane (DVPFH), 1H,1H, 6H,6H-Perfluorohexanediol diacrylate (PFHDA) and glyoxal bis (diallyl acetal) (GBDA).

For the alkyne crosslinking reagents according to compound (ii), L is preferably selected from a branched or straight chain $C_1$-$C_8$ alkylene or an ether group. L may be a $C_3$, $C_4$, $C_5$, or $C_6$ alkylene, preferably a straight chain alkylene. Chemical structures for the particularly preferred crosslinking reagents are set out below in Table 1:

TABLE 1

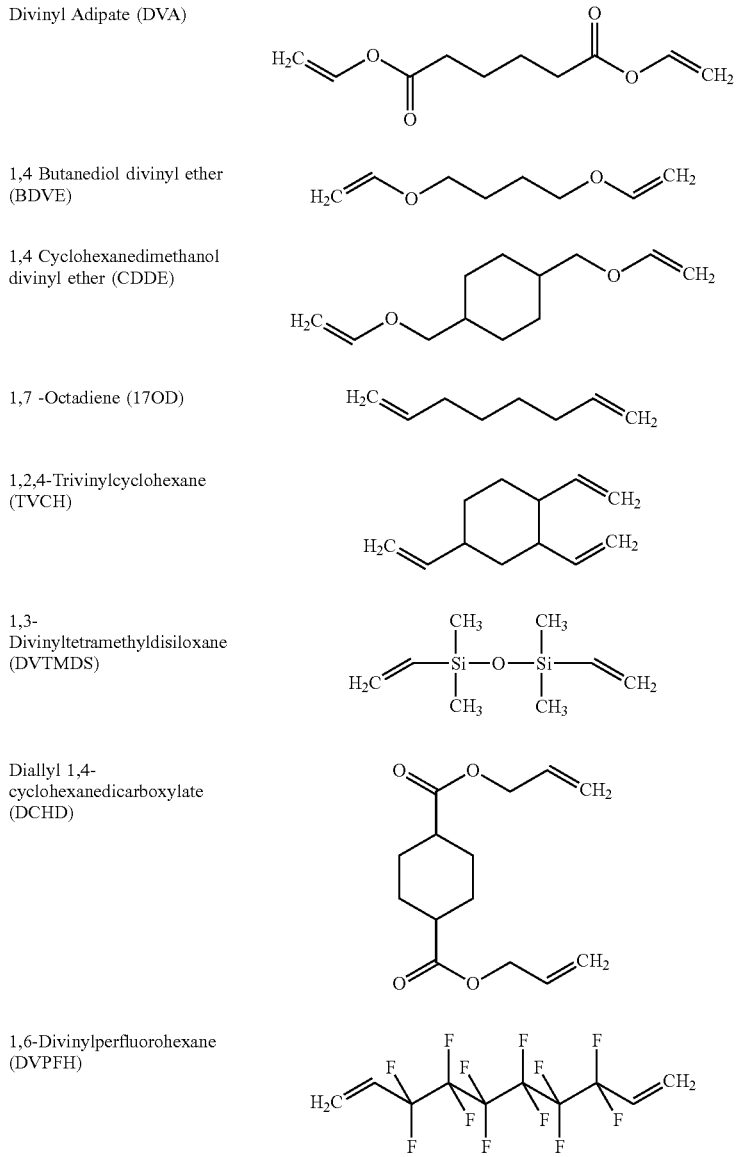

TABLE 1-continued

| | |
|---|---|
| 1H,1H,6H,6H-Perfluorohexanediol diacrylate (PFHDA) | ![PFHDA structure] |
| GBDA | ![GBDA structure] |
| 1,6-heptadiyne | HC≡—⁀—≡CH |
| 1,7-heptadiyne | HC≡—⁀⁀—≡CH |
| 1,8-heptadiyne | HC≡—⁀⁀⁀—≡CH |
| Propargyl ether | HC≡—O—≡CH |

Monomer Compound

The monomer compound has the following formula:

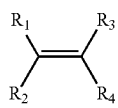

where $R_1$, $R_2$ and $R_4$ are each independently selected from hydrogen, optionally substituted branched or straight chain $C_1$-$C_6$ alkyl or halo alkyl or aryl optionally substituted by halo, and $R_3$ is selected from:

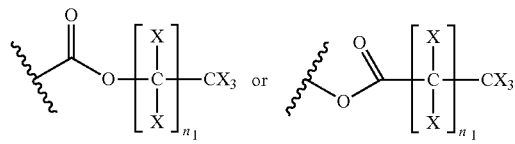

where each X is independently selected from hydrogen, a halogen, optionally substituted branched or straight chain $C_1$-$C_6$ alkyl, halo alkyl or aryl optionally substituted by halo; and $n_1$ is an integer from 1 to 27. Preferably, $n_1$ is from 1 to 12. Optionally $n_1$ is from 4 to 12, optionally 6 to 8.

In a preferred embodiment $R_3$ is selected from:

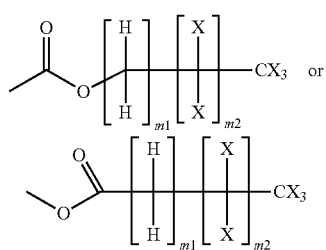

where $m_1$ is an integer from 0 to 13 and each X is independently selected from hydrogen, a halogen, optionally substituted branched or straight chain $C_1$-$C_6$ alkyl, halo alkyl or aryl optionally substituted by halo; and m2 is an integer from 2 to 14;

In a particularly preferred embodiment the monomer is a compound of formula I(a):

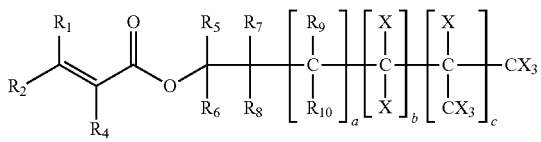

I(a)

wherein each of $R_1$, $R_2$, $R_4$, and $R_5$ to $R_{10}$ is independently selected from hydrogen or an optionally substituted $C_1$-$C_6$ branched or straight chain alkyl group; each X is independently selected from hydrogen or halogen; a is from 0-10; b is from 2 to 14; and c is 0 or 1;

or the monomer is a compound of formula I(b):

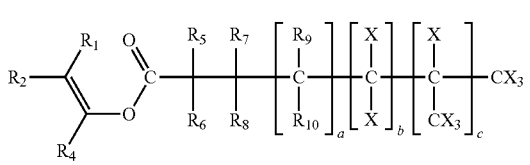

I(b)

wherein each of $R_1$, $R_2$, $R_4$, and $R_5$ to $R_{10}$ is independently selected from hydrogen or an optionally substituted $C_1$-$C_6$ branched or straight chain alkyl group; each X is independently selected from hydrogen or halogen; a is from 0-10; b is from 2 to 14; and c is 0 or 1.

The halogen may be chlorine or bromine, but is preferably fluorine for compliance with RoHS regulations (Restriction of Hazardous Substances).

a is from 0 to 10, preferably from 0 to 6, optionally 2 to 4, most preferably 0 or 1. b is from 2 to 14, optionally from 2 to 10, preferably 3 to 7.

Each of $R_1$, $R_2$, $R_4$, and $R_5$ to $R_{10}$ is independently selected from hydrogen or a $C_1$-$C_6$ branched or straight chain alkyl group. The alkyl group may be substituted or unsubstituted, saturated or unsaturated. When the alkyl group is substituted, the location or type of the substituent is not especially limited provided the resultant polymer provides an appropriate liquid repellent and/or barrier layer. The skilled person would be aware of suitable substituents. If the alkyl group is substituted, a preferred substituent is halo, i.e. any of $R_1$, $R_2$, $R_4$, and $R_5$ to $R_{10}$ may be haloalkyl, preferably fluoro alkyl. Other possible substituents may be hydroxyl or amine groups. If the alkyl group is unsaturated it may comprise one or more alkene or alkyne groups.

Each of $R_1$, $R_2$, $R_4$, and $R_5$ to $R_{10}$ may be independently selected from hydrogen, methyl, ethyl, n-propyl, isopropyl, n-butyl, isobutyl, tert-butyl, sec-butyl, n-pentyl, neopentyl, n-hexyl, isohexyl, and 3-methylpentyl.

In a preferred embodiment each of $R_1$, $R_2$, $R_4$, and $R_5$ to $R_{10}$ is independently selected from hydrogen or methyl.

In a preferred embodiment, a and c are each independently 0 or 1; and b is from 3 to 7.

In one preferred embodiment each X is H. In an alternative preferred embodiment each X is F.

Optionally $R_1$ and $R_2$ are both hydrogen.

Optionally $R_4$ is hydrogen or methyl. Preferably $R_1$ and $R_2$ are both hydrogen and $R_4$ is hydrogen or methyl.

Optionally $R_9$ is hydrogen and $R_{10}$ is branched or straight chain $C_1$-$C_6$ alkyl group. In a preferred embodiment $R_{10}$ is methyl.

In one embodiment each of $R_5$ to $R_8$ is hydrogen.

In one embodiment each of $R_1$, $R_2$, $R_4$, and $R_5$ to $R_{10}$ is hydrogen, each X is H, a=0 and c=0.

In a particularly preferred embodiment the monomer compound has the following formula:

where n is from 2 to 10.

In another preferred embodiment the monomer compound has the following formula:

where n is from 2 to 10.

The monomer compound may be selected from 1H,1H,2H,2H-perfluorohexyl acrylate (PFAC4), 1H,1H,2H,2H-perfluorooctyl acrylate (PFAC6), 1H,1H,2H,2H-perfluorodecyl acrylate (PFAC8) and 1H,1H,2H,2H-perfluorododecyl acrylate (PFAC10).

The monomer compound may be selected from 1H,1H,2H,2H-pefluorohexyl methacrylate (PFMAC4), 1H,1H,2H,2H-perfluorooctyl methacrylate (PFMAC6) and 1H,1H,2H,2H-perfluorodecyl methacrylate (PFMAC8).

The monomer compound of formula I(a) may have the following formula:

wherein a and c are each independently 0 or 1, b=3-7 and n is 4 to 10, where n=a+b+c+1.

The monomer compound of formula I(a) may have the following formula:

where n is 2 to 12.

The monomer compound may be selected from ethyl hexyl acrylate, hexyl acrylate, decyl acrylate, lauryl dodecyl acrylate and iso decyl acrylate.

The monomer may have the following formula:

where n is from 4 to 14.

The monomer may have the following formula:

where n is from 4 to 14.

In an additional aspect, the present invention provides a method for treating an electronic device or component thereof comprising:

exposing the electronic or electrical device or component thereof to a plasma comprising a monomer compound and a crosslinking reagent for a period of time sufficient to allow a protective cross-linked polymeric coating to form on a surface of the electronic or electrical device or component thereof;

wherein the monomer compound has the following formula:

where $R_1$, $R_2$ and $R_4$ are each independently selected from hydrogen, optionally substituted branched or straight chain $C_1$-$C_6$ alkyl or halo alkyl or aryl optionally substituted by halo, and $R_3$ is selected from:

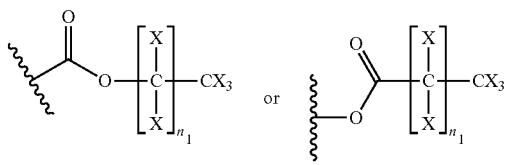

where each X is independently selected from hydrogen, optionally substituted branched or straight chain $C_1$-$C_6$ alkyl, halo alkyl or aryl optionally substituted by halo; and $n_1$ is an integer from 1 to 27; and wherein the crosslinking reagent comprises two or more unsaturated bonds and has a boiling point of less than 500° C. at standard pressure.

The monomer compound and the crosslinking reagent utilised in the method are described in further detail above.

Typically the electronic or electrical device or component thereof is placed in a plasma deposition chamber, a glow discharge is ignited within said chamber, and a voltage applied as a pulsed field.

Preferably the applied voltage is at a power of from 30 to 800 W. Optionally the voltage is pulsed in a sequence in which the ratio of the time on/time off is in the range of from 0.001 to 1, optionally 0.002 to 0.5. For example, time on may be 10-500 μs, preferably 35-45 μs, or 30-40 μs, such as about 36 μs and time off may be from 0.1 to 30 ms, preferably 0.1 to 20 ms, optionally from 5 to 15 ms, for example 6 ms. Time on may be 35 μs, 40 μs, 45 μs. Time off may be 0.1, 1, 2, 3, 6, 8, 10, 15, 20, 25 or 30 ms.

The term pulsed may mean that the plasma cycles between a state of no (or substantially no) plasma emission (off-state) and a state where a particular amount of plasma is emitted (on-state). Alternatively, pulsed may mean that there is continuous emission of plasma but that the amount of plasma cycles between an upper limit (on-state) and lower limit (off-state).

In a further embodiment, the invention resides in a method of forming a coating on an electronic or electrical device or component thereof as defined above, the method comprising: exposing said substrate in a chamber to a plasma comprising a monomer compound, preferably a continuous plasma, for a sufficient period of time to allow a protective polymeric coating to form on the substrate, wherein during exposure of the substrate the continuous plasma has a power density of at least 2 W/litre, preferably 20 W/litre.

Optionally the voltage is applied as a pulsed field for a period of from 30 seconds to 90 minutes. Optionally the voltage is applied as a pulsed field for from 5 to 60 minutes. Optionally in a preliminary step, a continuous power plasma is applied to the electronic or electrical device or component thereof. The preliminary step may be conducted in the presence of an inert gas.

Before the crosslinker and/or the monomer compound enter the deposition chamber each may be in the form of a gas, liquid or a solid (for example a powder) at room temperature. However, it is the preferred that the crosslinking reagent and the monomer compound are both liquid at room temperature, and most preferably that the monomer and crosslinker liquids are miscible.

The monomer compound and/or the crosslinker will suitably be in a gaseous state in the plasma. The plasma may simply comprise a vapour of the monomer compound and the crosslinker. Such a vapour may be formed in-situ, with the compounds being introduced into the chamber in liquid form. The monomer may also be combined with a carrier gas, in particular, an inert gas such as helium or argon.

In preferred embodiments, the monomer and/or the crosslinker may be delivered into the chamber by way of an aerosol device such as a nebuliser or the like, as described for example in WO2003/097245 and WO03/101621, the content of which is incorporated herein by reference. In such an arrangement a carrier gas may not be required, which advantageously assists in achieving high flow rates.

In one embodiment the monomer compound and/or the crosslinking reagent are in gaseous form and are fed into the plasma at a rate of from 10-5000 mg/minute depending on chamber volume, whilst the pulsed voltage is applied.

Optionally the plasma is created with an average power of from 0.001 to 40 W/litre.

The crosslinker may be miscible with the monomer and so introduced together or separately into the plasma chamber. Or the crosslinker may be immiscible with the monomer and introduced separately into the plasma chamber. In this context, the term "miscible" means that the crosslinker is soluble in the monomer, and when mixed they form a solution of uniform composition. The term "immiscible" is used to mean that the crosslinker is only partly soluble or insoluble in the monomer, and so either forms an emulsion or separates out into two layers.

The crosslinking reagent is preferably present in an amount of from 10 to 60 (v/v) %, optionally 20 to 40 (v/v) %, optionally 25 to 30 (v/v) %, optionally 30 to 50 (v/v) % of the total volume of monomer compound and crosslinking reagent, depending on the specific crosslinker. The skilled person would understand that the amount will vary to some extent depending on whether the coating is required to be liquid repellent or provide a barrier to mass and electron transport. The skilled person would understand that the (v/v) percentages are those which give a stable crosslinked polymer coating and the highest water contact angle.

Electronic or Electrical Device or Component Thereof

Although the invention is of benefit in the context of a wide variety of substrates, the substrate may, in all aspects of the invention, advantageously be an electronic substrate.

In some embodiments of the invention, the electronic substrate may comprise an electronic or electrical device, i.e. any piece of electrical or electronic equipment. Non-limiting examples of electrical and electronic devices include communications devices such as mobile phones, smartphones and pagers, radios, and sound and audio systems such as loudspeakers, microphones, ringers or buzzers, hearing aids, personal audio equipment such as personal CD, tape cassette or MP3 players, televisions, DVD players including portable DVD players, video recorders, digi and other set-top boxes such as Sky, computers and related components such as laptop, notebook, tablet, phablet or palmtop computers, personal digital assistants (PDAs), keyboards, or instrumentation, games consoles in particular hand-held playstations and the like, data storage devices, outdoor lighting systems or radio antenna and other forms of communication equipment.

In preferred embodiments of the invention, the substrate may comprise or consist of an electronic component, e.g. a printed circuit board (PCB), a printed circuit board array (PCBA), a transistor, resistor, or semi-conductor chip. The electronic component may thus be an internal component of an electronic device, e.g. a mobile phone. The coatings of the invention are particularly valuable in preventing electrochemical migration in such components.

In all aspects of the invention, the precise conditions under which the protective polymeric coating is formed in an effective manner will vary depending upon factors such as, without limitation, the nature of the monomer compound, the crosslinking reagent, the substrate, as well as the desired properties of the coating. These conditions can be determined using routine methods or, preferably, using the techniques and preferred features of the invention described herein, which work in particular synergy with the invention.

BRIEF DESCRIPTION OF DRAWINGS

The present invention will now be further described with reference to the following non-limiting examples and the accompanying illustrative drawings, of which.

EXAMPLE 1

Example of Plasma Polymerising PFAC6 with No Crosslinker in a 3 Litre Chamber

PFAC6 was polymerised in a 3 litre glass chamber using a continuous plasma process. In the experimental matrix, the continuous plasma was produced using RF power levels of 50, 100 and 200 Watts. The process pressure was run at 30, 60 and 90 mTorr and the monomer flow rate run at 50, 100 and 200 microlitres of liquid per minute. The duration of the process was either 10 or 40 minutes. The coated substrate was silicon wafer and whether the coating was tacky or not was determined by wiping the substrate with a finger and determining by eye if the coating had smeared. The results in FIG. 1 indicate that for lower CW powers, the coating could easily be smeared (i.e. tacky), but by increasing the power to flow ratio, the coating became resistant to smearing (i.e. non-tacky) and this is expected to be due to additional crosslinking caused by more monomer fragmentation. The water contact angle was also seen to decline with increasing power to flow ratio, and this too is indicative of more power increasing the level of monomer fragmentation.

Figure 2:
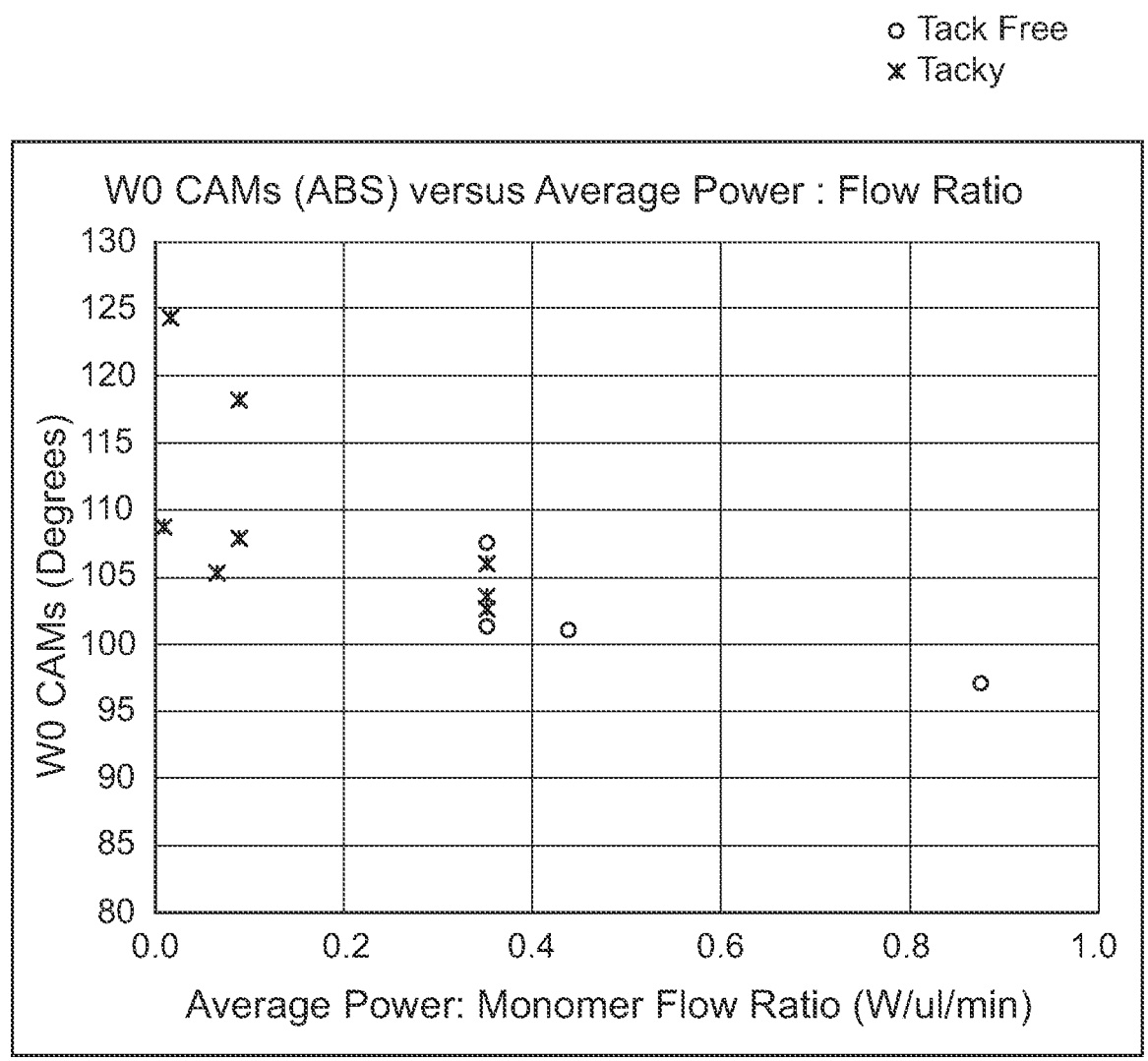
FIG. 2 shows the same effect for pulsed plasma conditions.
Figure 3:
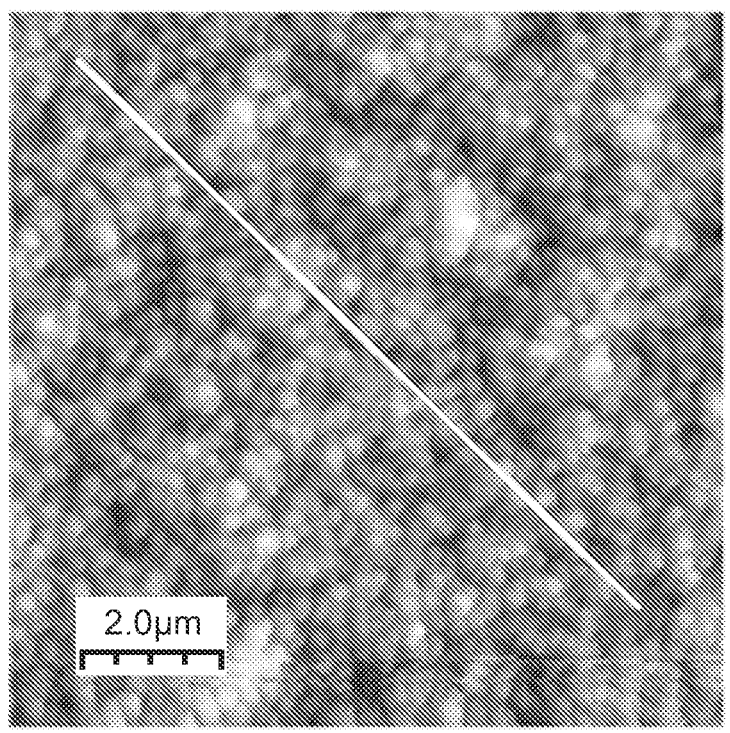
FIG. 3 shows a tapping mode image over 10×10 µm² field of view of a specimen example (thickness d=1230 nm) prepared according to Example 1 (left hand side) and a contour line plot showing the data used for calculation of RMS roughness (right hand side). The ΔZ value indicated on the plot has been taken over an area of the graph that represents the majority of the coating. Peaks that lie above the ΔZ range indicate large particles and troughs that fall below the ΔZ range show voids or pinholes in the coating. The width of the peaks also gives an indication of the particle size.
Figure 3:
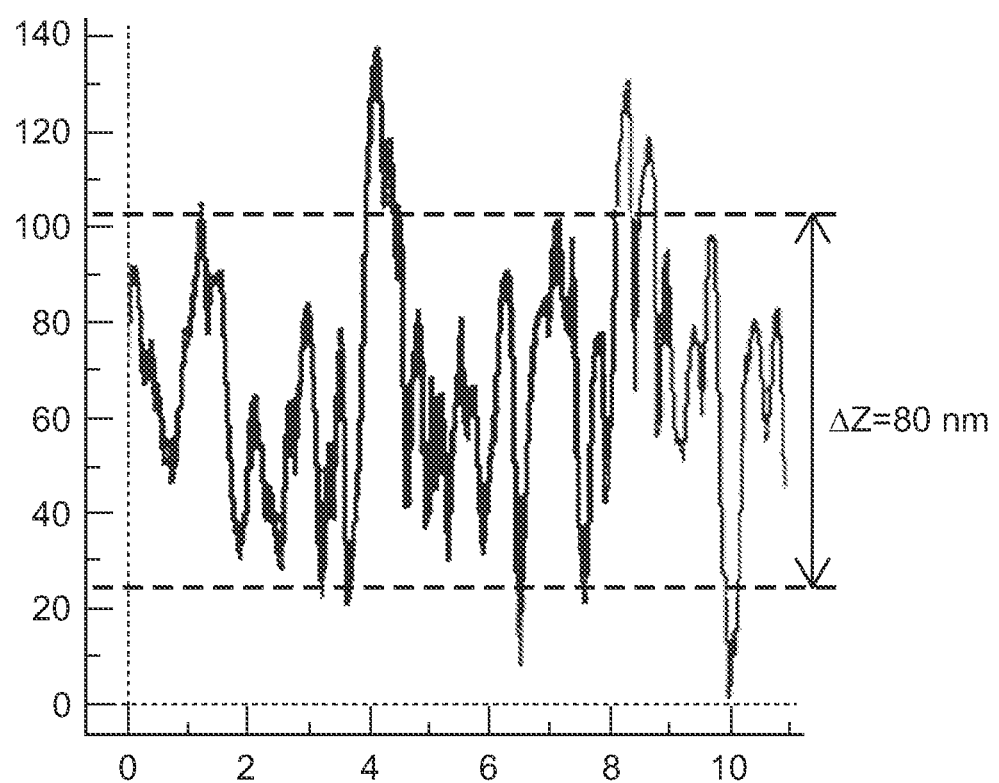

The same 3 litre chamber was used to also look at the effect of power to flow ratios with pulsed plasma polymerisation. In these experiments, the peak power was either 250 or 500 W. The RF power feed was pulsed with an on time of 35 microseconds and off times of 5.5 and 1 millisecond. Process pressure was either 20, 35, 60 or 80 mTorr. The monomer flow was either 50 or 200 microlitres of liquid per minute. FIG. 2 shows that low power to flow conditions can generate coatings that can be smeared (tacky) and only by increasing the power could the smear be reduced. This too had a concomitant decline in water contact angle.

Figure 1:
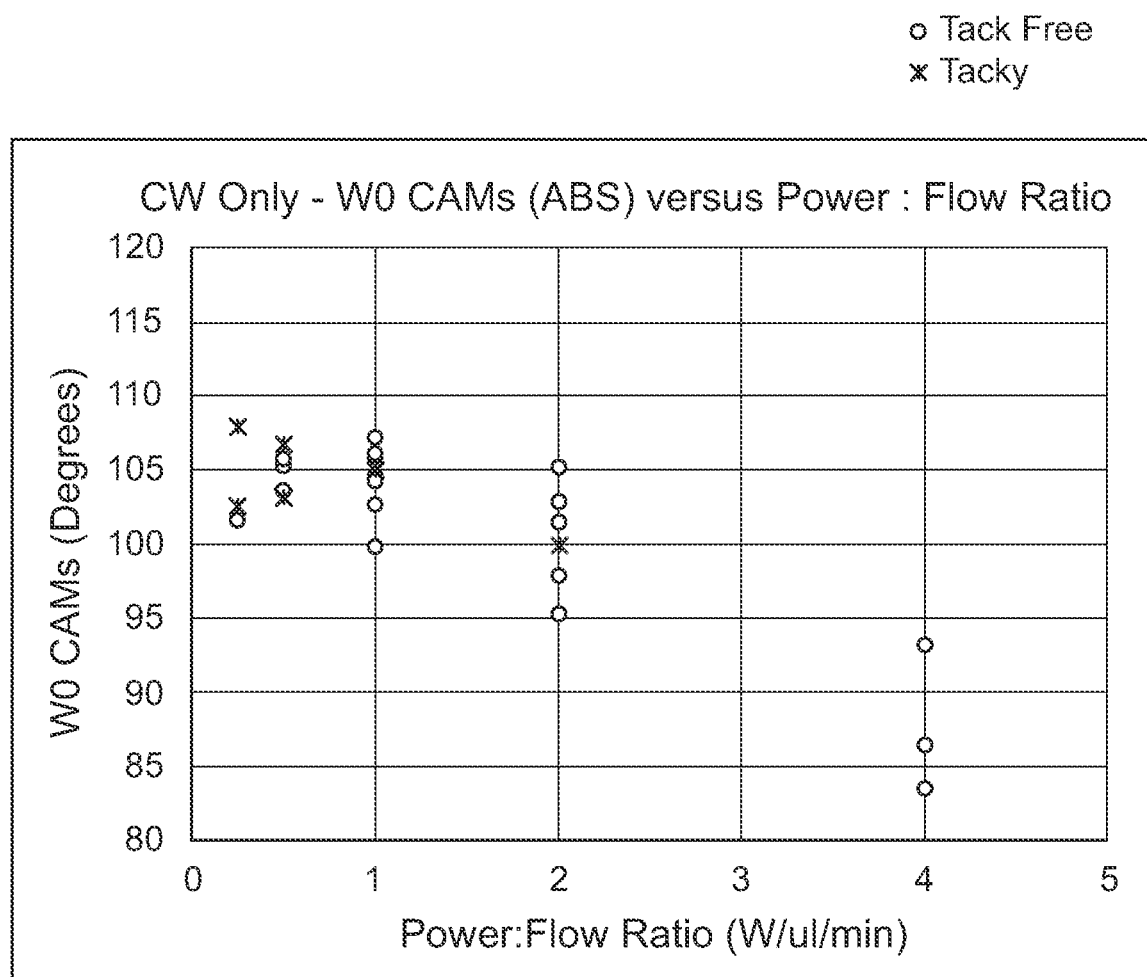
FIG. 1 illustrates shows the effect of increasing the power to monomer flow ratio for CW plasmas in a 3 litre chamber in a prior art process.

The results from FIGS. 1 and 2 show that plasma processing PFAC6 on its own could only lead to smear-free coatings when the powers were high enough to decrease the other desirable property of the water contact angle This illustrates the need to add a crosslinker to prevent the coating smearing and maintain the water contact angle.

EXAMPLE 2

Examples of Perfluoro Alkyl Acrylate Co-Polymerisation with Crosslinker to Show Improvements in Electrical Resistance Perfluorooctyl acrylate monomer was mixed with a single crosslinker from the following list:
 VINYL ESTERS: Divinyl adipate (DVA)
 VINYL ETHERS: 1,4-Butanediol divinyl ether (BDVE); 1,4 Cyclohexanedimethanol divinyl ether (CDDE)
 DI- or TM-VINYLS: 1,7-Octadiene (1,7-OD); 1,2,4-Trivinylcyclohexane (TVCH); DI VINYL with alkyl fluoro group: 1,6-divinylperfluorohexane (DVPFH)
 DI VINYL with silicon group: 1,3-Divinyl tetramethyldisiloxane (DVTMDS)
 DI VINYL with cyclic ring and carboxylate groups: Diallyl 1,4-cyclohexanedicarboxylate (DCHC)
 DI ACRYLATE: 1H1H,6H,6H-perfluorohexanediol diacrylate (PFHDA)

The crosslinker was mixed with the PFAC6 as a percentage by volume for the following percentages: 20, 40, 60, 80, and 100%.

Figure 5:
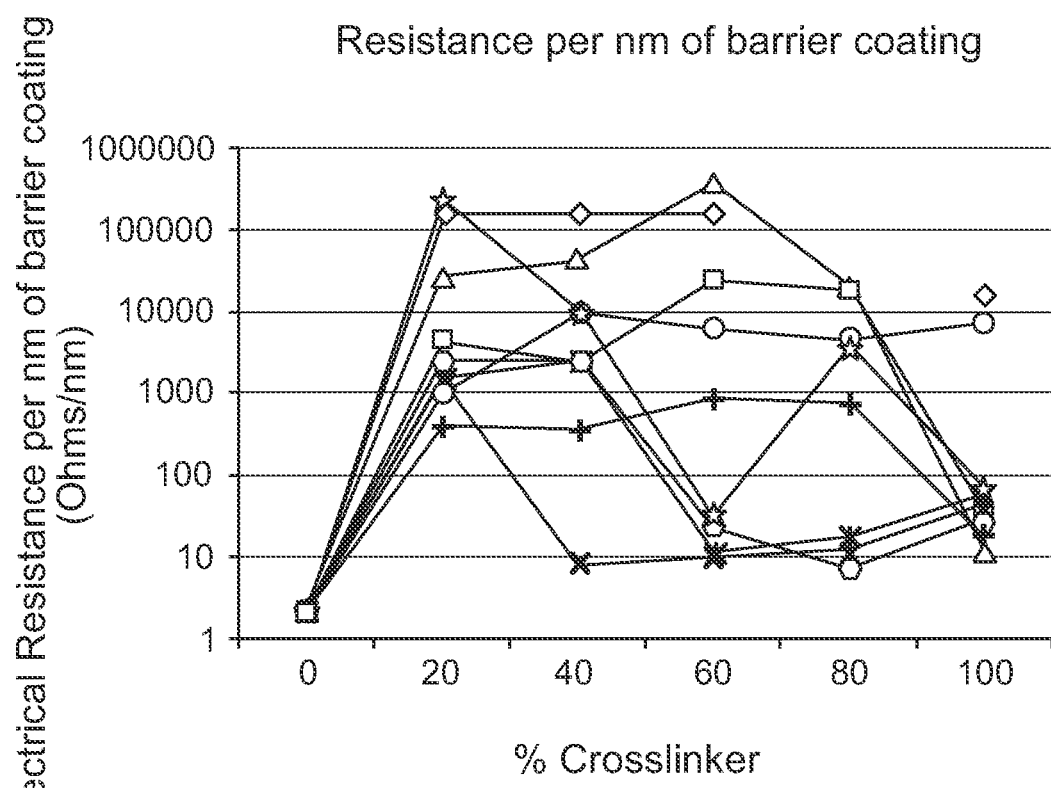
FIG. 5 shows the effect of adding crosslinkers in accordance with the invention on the electrical resistance per nm of the coatings.

Plasma initiated polymerisation reactions were carried out in a 3 litre glass plasma chamber. The substrates were test circuit boards. The PFAC6/crosslinker mixture was introduced at a rate of 0.04-0.06 ul/min and the process pressure was 40 mTorr. The process plasma consisted of a 1 minute continuous plasma (CW) step of 50 W followed by 10-20 minute pulsed plasma (PW) step of 50 W and RF power being delivered by a pulse sequence with a duty cycle of 6.9%. The coated circuit boards were immersed in tap water and an 8V potential was applied for 13 minutes. The final current readings, together with coating thickness measurements, were used to calculate the electrical resistance per nm of coating. FIG. 5 below shows the effect of adding a range of crosslinkers on the electrical resistance per nm of the barrier coatings. FIG. 5 clearly shows the improvement in resistance that can be gained by adding the crosslinker to the PFAC6 monomer. Furthermore, all of the crosslinkers tested gave non-smear/non-tacky coatings with concentration levels of 20% and above, with the exceptions of DVTMDS, DCHD, PFHDA and DVPFH which were non-smear at levels of 40% and above.

EXAMPLE 3

Example of Crosslinker Concentration on Water Repellent Coating.

Figure 4:
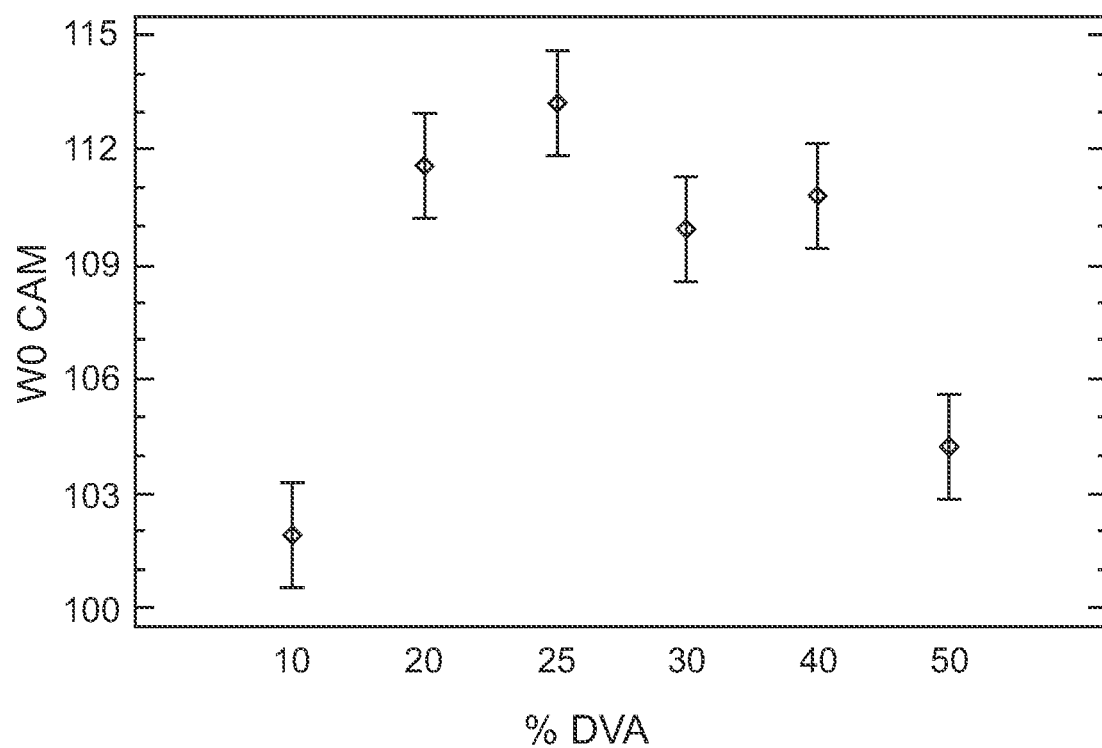
FIG. 4 illustrates the effect of adding the divinyl adipate crosslinker to perfluorooctyl acrylate on water contact angle from a process on a 125 Litre chamber.

Water repellent coatings were prepared in a 125 litre volume chamber using PFAC6 with different levels of divinyl adipate (DVA) and using helium as a carrier gas. The deposition process consisted of a 3 minute CW step with 300 W power and a pulsed step with 150 W power and an RF pulse duty cycle of 0.018%. Silicon wafer was used as the test substrates and the contact angle of the coated wafer was determined by applying a 3 ul drop of deionised wafer onto the coated wafer and measuring the contact angle using a VCA Optima (AST products) with image analysis software. The variation of contact angle with (v/v) % DVA crosslinker is shown in FIG. 4. It was also noted that for the 10 (v/v) % DVA concentration, the water drop left a mark on the coated wafer where it's circumference had been. This indicated that a higher level of crosslinker was required to give a more stable coating. This observation, in combination with the results in FIG. 4, suggest an optimum range of 20-40 (v/v) % DVA crosslinker, though this is likely to vary, typically within the range of from 10-60 (v/v) % for different monomers and crosslinkers and different chamber sizes.

Pulsed plasma polymerisation of perfluoro alkyl acrylate in the presence of divinyl adipate (DVA) was carried out in a 125 litre chamber. FIG. 4 shows the effect of adding different liquid volume percentages of DVA crosslinker to perfluorooctyl acrylate on water contact angle on a silicon wafer substrate.

EXAMPLE 4

Example of AFM Measurement of Monomer/Crosslinker Co-Polymer Coating

Figure 6:
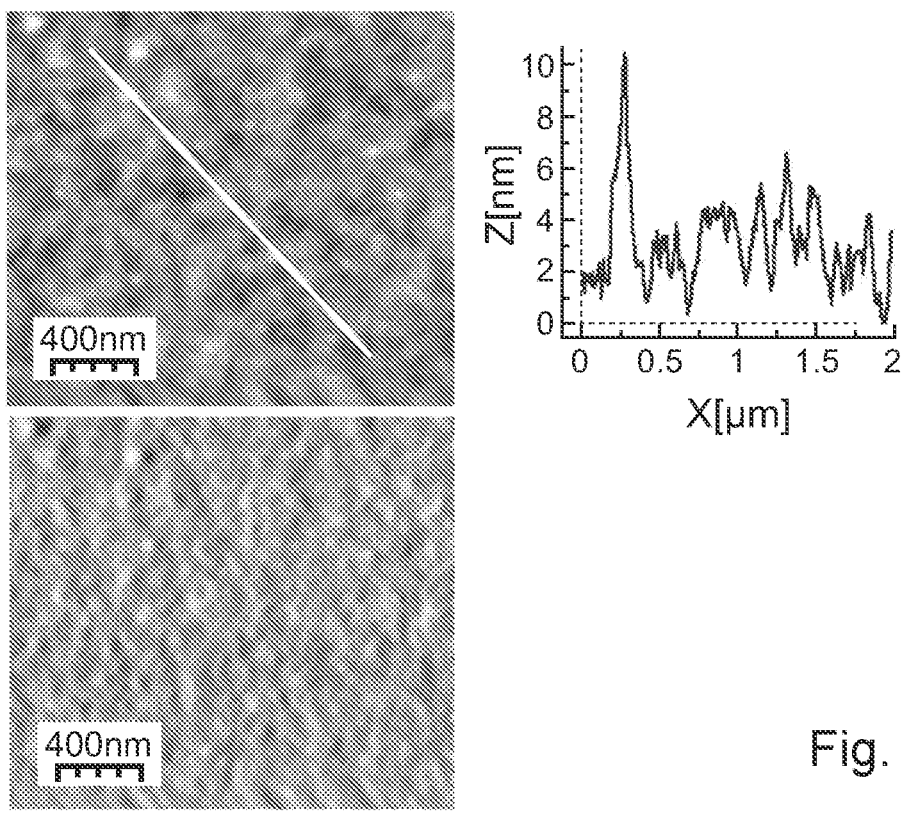
FIG. 6 shows a tapping mode image of a 90 nm thick coating, prepared as described in Example 3, over 2×2 µm² field of view (top left), a representative contour line indicating height variation (z-axis) of the coating (top right) and a phase image indicating full substrate coverage (bottom left); RMS roughness of the coating is 1.65 nm and Δz/d=0.05

A barrier-style coating was prepared in a 22 litre volume chamber using PFAC6 with 10% DVA. The deposition process consisted of a 1 minute CW step with a CW power to flow ratio of 3.9 (W/microliter/min), and a pulsed step with a PW power/monomer flow ratio of 0.28 (W/microlitres/min). FIG. 6 shows the representative topographical and phase contrast images were obtained from all the samples. High spatial resolution images show mainly the structures of areas between the raised features. The RMS roughness of the coating is 1.65 nm and the $\Delta z/d = 0.05$. As the $\Delta z/d$ value is <0.15, then this indicates that the physical layer is substantially pinhole free.

EXAMPLE 5

Example of FTIR/ATR Measurement of Monomer/Crosslinker Co-Polymer Coating

Figure 7:
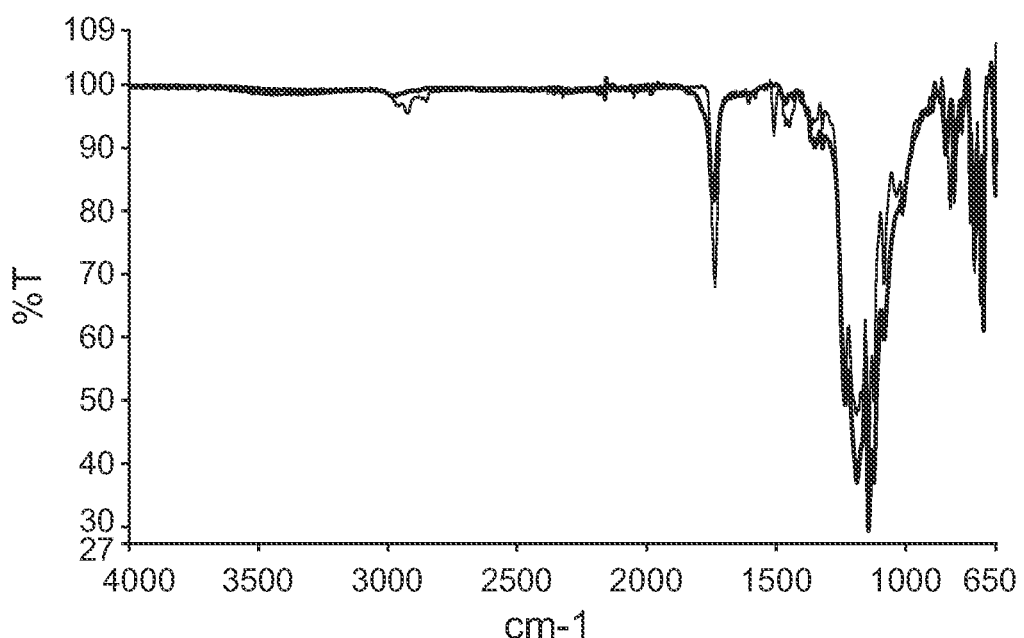
FIG. 7 shows a FTIR/ATR spectrum of a coating formed according to Example 5.

Two barrier-style coatings were prepared in a 22 litre volume chamber using PFAC6 only and PFAC6 with 10% DVA as described in example 4. The deposition process consisted of a 1 minute CW step with a CW power to flow ratio of 3.9 (W/microliter/min), and a pulsed step with a PW power/monomer flow ratio of 0.28 (W/microlitres/min). FIG. 7 shows the representative FTIR/ATR spectrum obtained from both samples.

The FTIR/ATR intensity ratios of peaks attributed to stretching mode of $CF_3$ and $C=O$ groups, $CF_3/C=O$, of the coating is indicative of sufficient cross linking in the coating to form a physical barrier. $CF_3$ refers to the terminal groups in the side chain of PFAC6.

Formation of the barrier coatings is believed to be caused by a mixture of cross linking and controlled fragmentation of the monomers during polymerisation. Cross linking is believed to be predominantly via the CF2-CF3 chain, whilst fragmentation is thought to be predominantly through loss of the $C=O$ group during polymerisation and to a lesser extent shortening of the CF2 chain. Cross linking effects the abundance of —CF3 groups in the coating and controlled fragmentation controls the amount of $C=O$ groups in the coating. The ratio of these two functional groups is an indication that sufficient cross-linking and fragmentation has taken place and can be measured by the ratio of the intensities of the corresponding FTIR/ATR peaks.

It has been shown that coatings with reduced $CF_3/C=O$ ratios give higher resistance values in the electrical test, as described in Example 2, showing an improved coating performance on increased cross linking (for $CF_3$) and fragmentation (for $C=O$). If the FTIR/ATR intensity ratio of the peaks attributed to —$CF_3$ stretching and $C=O$ stretching, $CF_3/C=O$, is less than $0.6e^{-0.1n}$ (where n=6 for PFAC6) the resistance of the coating at the electrical test is expected to be higher than 8 MOhms.

The peak intensity ratio $CF_3/C=O$ the coating thickness and the final current readings during the electrical test are shown in table 2:

TABLE 2

|  | Thickness (nm) | Resistance in water at 8 V (Ohms) | $CF_3/C=O$ ATR peak intensity ratio |
|---|---|---|---|
| PFAC6 | 1480 | $2.1 \times 10^7$ | 0.23 |
| PFAC6 and 10% DVA (in volume) | 1450 | $9.2 \times 10^9$ | 0.11 |

What is claimed is:

1. An electronic or electrical device or electronic or electrical component thereof comprising a protective cross-linked polymeric coating on a surface of the device or component;
   wherein the protective cross-linked polymeric coating is obtained by exposing the device or component to a plasma comprising a monomer compound and a cross-linking reagent for a period of time sufficient to allow formation of the protective cross-linked polymeric coating on a surface thereof,
   wherein the monomer compound has the following formula:

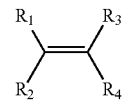

where $R_1$, $R_2$ and $R_4$ are each independently selected from hydrogen, optionally substituted branched or straight chain $C_1$-$C_6$ alkyl or halo alkyl or aryl optionally substituted by halo, and $R_3$ is selected from:

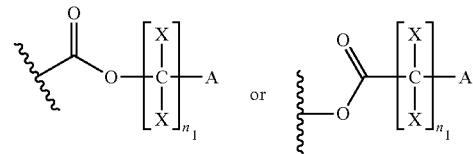

where each X is independently selected from hydrogen, a halogen, optionally substituted branched or straight chain $C_1$-$C_6$ alkyl, halo alkyl or aryl optionally substituted by halo; where A is aryl optionally substituted by halo; and $n_1$ is an integer from 0 to 27; and wherein the crosslinking reagent comprises two or more unsaturated bonds attached by means of one or more linker moieties and has a boiling point of less than 500° C. at standard pressure the crosslinking reagent having one of the following structures:

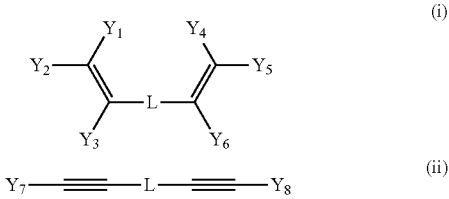

(i)

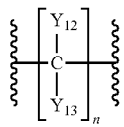

(ii)

where $Y_1$, $Y_2$, $Y_3$, $Y_4$, $Y_5$, $Y_6$, $Y_7$ and $Y_8$ are each independently selected from hydrogen, optionally substituted cyclic, branched or straight chain $C_1$-$C_6$ alkyl or aryl; and L is a linker moiety;
wherein for compound (i) L is of formula A having one of the following structures:

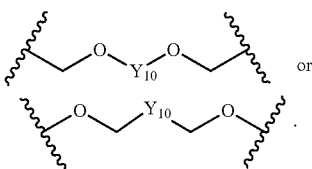

and $Y_{10}$ is selected from optionally substituted cyclic, branched or straight chain $C_1$-$C_8$ alkylene and a siloxane group;
or wherein for compound (i) L is of formula B having the following formula:

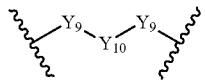

where each $Y_9$ is independently selected from, a bond, —O—, —O—C(O)—, —C(O)—O—, —$Y_{11}$—O—C(O)—, —C(O)—O—$Y_{11}$—, —O$Y_{11}$—, and $Y_{11}$O—, where $Y_{11}$ is an optionally substituted cyclic, branched or straight chain $C_1$-$C_8$ alkylene; and wherein $Y_{10}$ has the following formula:

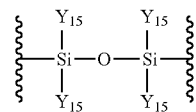

and each $Y_{15}$ is independently selected from optionally substituted branched or straight chain $C_1$-$C_6$ alkyl;
or wherein $Y_{10}$ has the following formula:

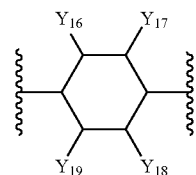

and $Y_{16}$ to $Y_{19}$ are each independently selected from H and optionally substituted branched or straight chain $C_1$-$C_8$ alkyl or alkenyl or wherein $Y_{10}$ has the following formula:

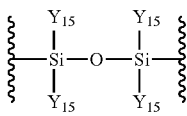

and each $Y_{12}$ is fluoro and each $Y_{13}$ is fluoro, and n is an integer from 1 to 10.

2. A device or component according to claim 1, wherein the protective cross-linked polymeric coating is a physical barrier to mass and electron transport.

3. A device or component according to claim 1, wherein the protective cross-linked polymeric coating forms a liquid repellent surface defined by a static water contact angle (WCA) of at least 90°.

4. A device or component according to claim 1, wherein n is from 4 to 6.

5. A device or component according to claim 1, wherein $Y_{10}$ has the following formula:

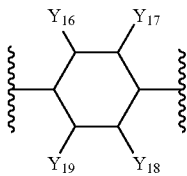

and each $Y_{15}$ is methyl, and each $Y_9$ is a bond.

6. A device or component according to claim 1, wherein $Y_{10}$ has the following formula:

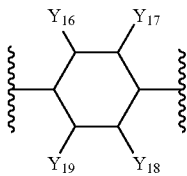

and wherein $Y_{18}$ is H or vinylene, and $Y_{16}$, $Y_{17}$ and $Y_{19}$ are each H.

7. A device or component according to claim 1 wherein the crosslinking reagent is selected from 1,4-butanediol divinyl ether (BDVE), 1,4-cyclohexanedimethanol divinyl ether (CDDE), 1,2,4-trivinylcyclohexane (TVCH), 1,3-divinyltetramethyldisiloxane (DVTMDS), diallyl 1,4-cyclohexanedicarboxylate (DCHD), 1,6-divinylperfluorohexane (DVPFH), 1H,1H,6H,6H-perfluorohexanediol diacrylate (PFHDA) and glyoxal bis (diallyl acetal) (GBDA).

8. A device or component according to claim 1, wherein for compound (ii), L is selected from a branched or straight chain $C_1$-$C_8$ alkylene or an ether group.

9. A device or component according to claim 1 wherein each X is H.

10. A device or component according to claim 1, wherein each X is F.

11. A device or component according to claim 1, wherein the device or component is selected from a mobile phone, smartphone, pager, radio, sound and audio system, hearing aid, personal audio equipment, television, DVD player including portable a DVD player, video recorder, digi or other set-top boxes, computer or related component, personal digital assistant (PDA), keyboard, instrument, games console, data storage device, outdoor lighting system, radio antennae or other form of communication equipment, or printed circuit board.

12. A device or component according to claim 11, wherein the sound and audio system is a loudspeaker, microphone, ringer and/or buzzer.

13. A device or component according to claim 11, wherein the personal audio equipment is a personal CD, tape cassette or MP3 player.

14. A device or component according to claim 11, wherein the computer or related component is a laptop, notebook, tablet, phablet or palmtop computer.

\* \* \* \* \*

(12) INTER PARTES REVIEW CERTIFICATE (4145th)
United States Patent
Coulson et al.

(10) Number: US 11,041,087 K1
(45) Certificate Issued: Oct. 6, 2025

(54) COATINGS

(71) Applicants: Stephen Richard Coulson; Delwyn Evans; Angeliki Siokou; Clive Telford

(72) Inventors: Stephen Richard Coulson; Delwyn Evans; Angeliki Siokou; Clive Telford

(73) Assignee: P2I LTD

Trial Number:
IPR2024-00380 filed Jan. 3, 2024

Inter Partes Review Certificate for:
Patent No.: 11,041,087
Issued: Jun. 22, 2021
Appl. No.: 16/547,728
Filed: Aug. 22, 2019

The results of IPR2024-00380 are reflected in this inter partes review certificate under 35 U.S.C. 318(b).

INTER PARTES REVIEW CERTIFICATE
U.S. Patent 11,041,087 K1
Trial No. IPR2024-00380
Certificate Issued Oct. 6, 2025

AS A RESULT OF THE INTER PARTES REVIEW PROCEEDING, IT HAS BEEN DETERMINED THAT:

Claims 1-5, 7, and 9-14 are cancelled.

\* \* \* \* \*